(12) United States Patent
Sharp

(10) Patent No.: US 10,643,351 B2
(45) Date of Patent: *May 5, 2020

(54) INDOOR NAVIGATION VIA MULTI BEAM LASER PROJECTION

(71) Applicant: Trimble Inc., Sunnyvale, CA (US)

(72) Inventor: Kevin A. I. Sharp, Picton (NZ)

(73) Assignee: Trimble Inc., Sunnyvale, CA (US)

(*) Notice: Subject to any disclaimer, the term of this patent is extended or adjusted under 35 U.S.C. 154(b) by 1153 days.

This patent is subject to a terminal disclaimer.

(21) Appl. No.: 13/847,585

(22) Filed: Mar. 20, 2013

(65) Prior Publication Data

US 2014/0285630 A1 Sep. 25, 2014

(51) Int. Cl.
| | |
|---|---|
| *G01C 21/20* | (2006.01) |
| *G06T 7/80* | (2017.01) |
| *G01S 5/16* | (2006.01) |
| *G06T 7/00* | (2017.01) |
| *G06T 7/73* | (2017.01) |
| *H03M 7/30* | (2006.01) |

(52) U.S. Cl.
CPC .......... *G06T 7/85* (2017.01); *G01S 5/16* (2013.01); *G06T 7/73* (2017.01); *G06T 7/97* (2017.01); *H03M 7/3059* (2013.01); *H03M 7/3062* (2013.01); *G06T 2207/10012* (2013.01)

(58) Field of Classification Search
CPC ....... G01C 21/206; G01C 11/00; H04N 13/00
See application file for complete search history.

(56) References Cited

U.S. PATENT DOCUMENTS

| | | | |
|---|---|---|---|
| 4,796,198 A | 1/1989 | Boultinghouse | |
| 5,137,354 A | 8/1992 | deVos | |
| 5,255,195 A | 10/1993 | Mochizuki | |
| 6,064,940 A | 5/2000 | Rodgers | |
| 7,305,277 B2 | 12/2007 | Freeman | |
| 7,720,554 B2 | 5/2010 | DiBernardo | |
| 7,774,083 B2 | 8/2010 | Freeman | |
| 7,899,618 B2 | 3/2011 | Ledet | |
| 8,224,030 B2 | 7/2012 | Otani | |
| 2001/0020127 A1* | 9/2001 | Oshio | A61B 90/36 600/429 |
| 2003/0208302 A1 | 11/2003 | Lemelson | |

(Continued)

FOREIGN PATENT DOCUMENTS

| | | |
|---|---|---|
| DE | 69019767 T2 | 2/1996 |
| EP | 0221643 A2 | 5/1987 |

(Continued)

OTHER PUBLICATIONS

Scharstein, "High-Accuracy Stereo Depth Maps Using Structured Light", Proceedings of the 2003 IEEE Computer Society Conference on Computer Vision and Pattern Recognition (CVPR'03).*

(Continued)

*Primary Examiner* — John R Schnurr
*Assistant Examiner* — Kyle M Lotfi
(74) *Attorney, Agent, or Firm* — Kilpatrick Townsend & Stockton LLP

(57) ABSTRACT

An indoor navigation system is based on a multi-beam laser projector, a set of calibrated cameras, and a processor that uses knowledge of the projector design and data on laser spot locations observed by the cameras to solve the space resection problem to find the location and orientation of the projector.

14 Claims, 7 Drawing Sheets

(56) References Cited

U.S. PATENT DOCUMENTS

| | | | |
|---|---|---|---|
| 2004/0001197 A1 | 1/2004 | Ko | |
| 2005/0211882 A1* | 9/2005 | Ohtomo | G01C 15/002 250/221 |
| 2008/0204699 A1 | 8/2008 | Benz | |
| 2011/0299059 A1* | 12/2011 | Buettgen | G01S 7/4911 356/5.01 |
| 2012/0050528 A1* | 3/2012 | Davies | G01C 11/02 348/136 |
| 2012/0148145 A1* | 6/2012 | Liu | G06T 7/0075 382/154 |
| 2012/0262365 A1* | 10/2012 | Mallinson | G01S 1/725 345/156 |
| 2013/0138246 A1* | 5/2013 | Gutmann | G05D 1/0231 700/253 |
| 2014/0098379 A1 | 4/2014 | Smits | |

FOREIGN PATENT DOCUMENTS

| | | | |
|---|---|---|---|
| JP | 2008204196 A | * | 9/2008 |
| WO | 2012041687 A1 | | 4/2012 |

OTHER PUBLICATIONS

Boochs et al. "Increasing the accuracy of untaught robot positions by means of a multi-camera system." 2010 International Conference on Indoor Positioning and Indoor Navigation (IPIN), Sep. 15-17, 2010, Zurich, Switzerland (Year: 2011).*

Sebastian Tilch et al "Current investigations at the ETH Zurich in optical indoor positioning" WPNC 2010 IEEE.

International Preliminary Report on Patentability in PCT/US2014/031270.

International Search Report and Written Opinion of the International Searching Authority in PCT/US2014/031270, dated Jul. 10, 2014.

Martin Habbecke et al., "LaserBrush: A Flexible Device for 3D Reconstruction of Indoor Scenes", ACM Symposium on Solid and Physical Modeling, 2008.

Sebastian Tilch et al., "Clips Proceedings", International Conference on Indoor Positioning and Indoor Navigation, Guimaraes, Portugal, Sep. 21, 2011.

Rainer Mautz et al., "Survey of Optical Indoor Positioning Systems", International Conference on Indoor Positioning and Indoor Navigation, Guimaraes, Portugal, Sep. 21, 2011.

Haralick et al., "Review and Analysis of Solutions of the Three Point Perspective Pose Estimation Problem", International Journal of Computer Vision, 13, 3, 331-356 (1994), Kluwer Academic, The Netherlands.

Schonemann, "A Generalized Solution of the Orthogonal Procrustes Problem", Psychometrika, 31, 1, 1-10 (1966), Springer, New York.

Grafarend et al., "Closed-form solution of P4P or the three-dimensional resection problem in terms of Mobius barycentric coordinates", Journal of Geodesy, 71, 217-231 (1997), Springer-Verlag, New York.

Ma et al., An Invitation to 3-D Vision, Chapter 5, 109-170 (2003), Springer, New York.

Non-Final Office Action for U.S. Appl. No. 13/922,530 dated Jan. 11, 2017, 19 pages.

U.S. Appl. No. 13/922,530 Final Office Action dated Jun. 30, 2017, 18 pages.

U.S. Appl. No. 13/922,530 Notice of Allowance dated Aug. 1, 2018, 18 pages.

U.S. Appl. No. 13/922,530 Non-Final Office Action dated Nov. 28, 2017, 20 pages.

* cited by examiner

INDOOR NAVIGATION VIA MULTI BEAM LASER PROJECTION

TECHNICAL FIELD

The disclosure is generally related to indoor navigation.

BACKGROUND

Conventional indoor navigation techniques include ultrasonic or laser ranging, tracking marked objects with cameras, and interpreting video scenes as captured by a camera. This last method, navigating as a person would by interpreting his visual surroundings, is an outstanding problem in computer vision research.

A variety of challenges are associated with these and other indoor navigation techniques. Occlusion, for example, occurs when a camera or detector's view is blocked. Lack of sensitivity can be an issue when object-tracking cameras are located too close to one another, leading to small angle measurements. Some vision-based navigation systems depend on surface texture which may not always be available in an image. Finally, incremental positioning methods may accumulate errors which degrade positioning accuracy.

Building construction is one scenario in which indoor navigation is a valuable capability. Robots that lay out construction plans or install fixtures need accurate position and orientation information to do their jobs. Assembly of large aircraft parts offers another example. Precisely mating airplane fuselage or wing sections is helped by keeping track of the position and orientation of each component. In scenarios like these, as a practical matter, it is helpful for indoor navigation solutions to be expressed in the same coordinates as locations of building structures such as walls, floors, ceilings, doorways and the like.

Many vision-based indoor navigation systems cannot run in real time because the computational requirements are too great. Finally, a navigation system for a small robot is impractical if it consumes too much power or weighs or costs too much. What is needed is an indoor navigation system that permits accurate tracking of the location and orientation of objects in an indoor space while overcoming the challenges mentioned above and without requiring excessive computational capacity, electrical power or weight.

DETAILED DESCRIPTION

Figure 1:
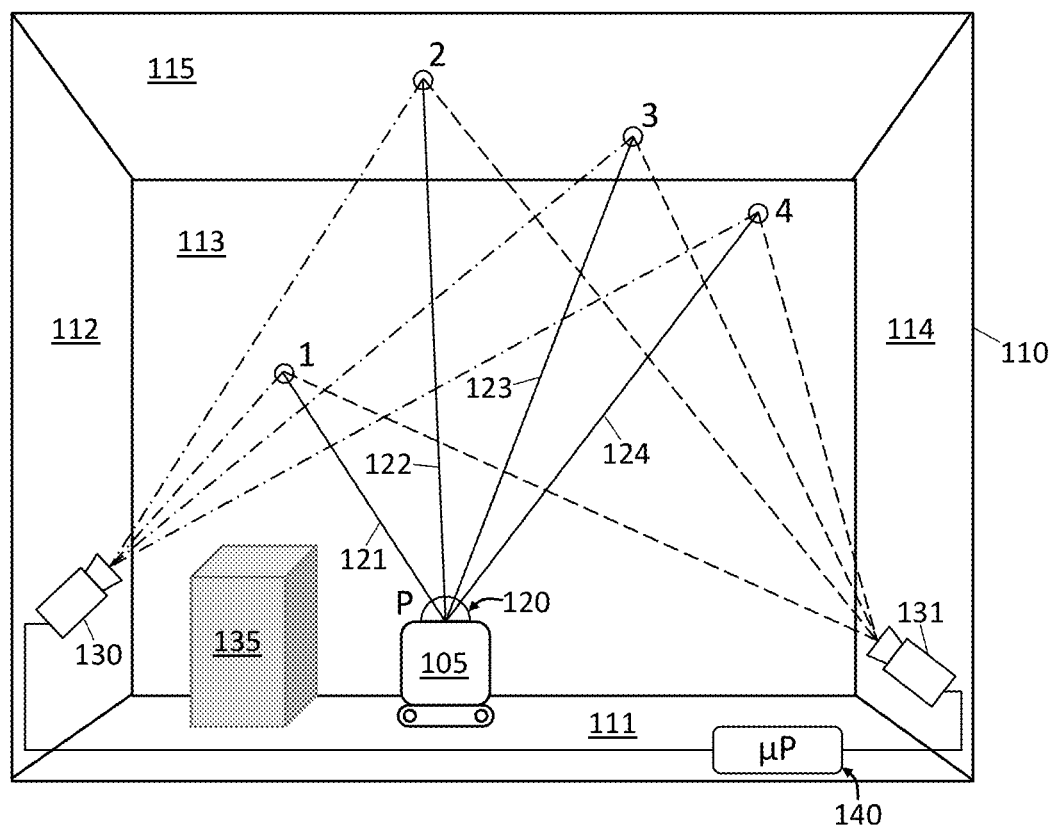
FIG. 1 shows an indoor navigation system.

The indoor navigation systems and methods described below involve solving a problem known in computer vision as "perspective pose estimation" and in photogrammetry as "space resection", namely: Determine the position of each of the vertices of a known triangle in three dimensional space given a perspective projection of the triangle. Haralick, et al. show how this problem was first solved by the German mathematician Grunert in 1841 and solved again by others later ("Review and Analysis of Solutions of the Three Point Perspective Pose Estimation Problem," International Journal of Computer Vision, 13, 3, 331-356 (1994), incorporated herein by reference).

Space resection has been used in the past to find the position and orientation of a camera based on the appearance of known landmarks in a camera image. Here, however, space resection is used to find the position and orientation of a laser projector that creates landmarks on the walls of an indoor space. In contrast to traditional space resection, in the present case angles to the landmarks are set by the laser projector rather than measured. When the projector is attached to an object, the position and orientation of the object may be estimated and tracked.

Navigation based on this new technique is well suited to indoor spaces such as office buildings, aircraft hangars, underground railway stations, etc. Briefly, a laser projector is attached to a robot, machine tool or other item whose position and orientation are to be estimated in an indoor space. The projector emits laser beams in four or more different directions and these beams are seen as spots on the walls of the indoor space. ("Walls" is defined to include walls, ceiling, floor and other surfaces in an indoor space upon which laser spots may be formed.) Multiple fixed cameras view the spots and provide data used to estimate their positions in three dimensions. Finally, the space resection problem is solved to estimate the position and orientation of the laser projector given the location of the spots on the walls and the relative directions of the laser beams transmitted from the object.

Indoor navigation based on multi-beam laser projection minimizes occlusion and sensitivity concerns through the use of a set of several laser beams spread out over a large solid angle. Multiple beams provide redundancy in cases such as a beam striking a wall or other surface at such an oblique angle that the center of the resulting spot is hard to determine, or half the beam landing on one surface and half landing on another. Having several beams pointed in various directions spread out over a half-sphere or greater solid angle, for example, largely eliminates sensitivity to unlucky geometries—small angles may be avoided. Each new measurement of laser projector position and orientation is directly referenced to building coordinates so measurement errors do not accumulate over time. Finally the computational requirements are modest and computations may be performed in a fixed unit separate from a tracked object.

The major components of a multi-beam laser projection indoor navigation system are: a laser projector, a set of observation cameras and a processor that solves space resection and other geometrical tasks. FIG. 1 shows such a system.

In FIG. 1 a robot 105 is situated in a room 110 that includes floor 111, walls 112, 113 and 114, and ceiling 115 ("walls" or "surfaces"). A laser projector 120 mounted on the robot emits four laser beams 121-124 which form spots 1-4. Spots 1 and 4 are on wall 113 while spots 2 and 3 are on ceiling 115. Although not illustrated here, spots may also fall on other surfaces and/or objects in the room. Cameras 130 and 131 are fixed in position such that they each can view spots 1-4 as suggested by the dash-dot and dashed lines. Opaque obstacle 135 blocks a direct line of sight from camera 130 to projector 120, but does not affect the operation of the navigation system. Microprocessor 140 (which includes associated memory and input/output devices) is in communication with cameras 130 and 131 via a wired or wireless data connection. Robot 105 is, of course, just an example of an object that may be tracked by the navigation system. Any object to which a laser projector can be attached would suffice.

When properly calibrated, cameras 130 and 131 may be used to estimate the three dimensional position of any point that both can see. For example if both cameras can see spots 1, 2, 3 and 4, then the three dimensional coordinates of each spot can be estimated in a coordinate system used to locate the walls and other features of the room. Meanwhile, laser projector emits laser beams 121-124 at known azimuths and elevations as measured with respect to the robot. The angle between each pair of laser beams is therefore also known. As discussed in detail below, this provides enough information to estimate the position and orientation of the laser projector, and the object to which it is attached, in room coordinates.

Figure 2:
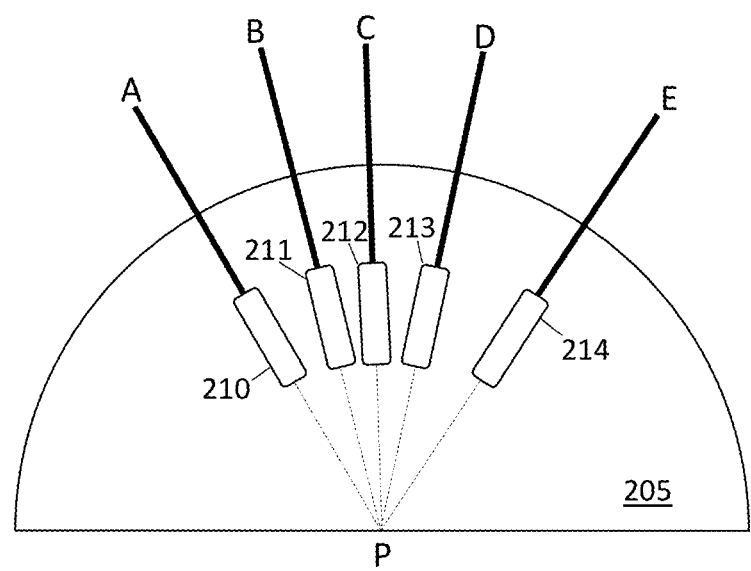
FIG. 2 illustrates a multi-beam laser projector.

FIG. 2 illustrates a multi-beam laser projector 205 in greater detail. In the example provided by FIG. 2, projector 205 emits five laser beams A, B, C, D and E. Four is a practical minimum number of beams and more is helpful. Despite the two-dimensional appearance of the figure, the beams do not all lie in a one plane. In an embodiment no more than two beams lie in any particular plane and the angle between any pair of laser beams is different from that between any other pair. In an embodiment the back projections of each beam intersect at common point, P. Said another way, directions of the laser beams coincide at point P. Point P need not lie inside the projector although it is illustrated that way in FIG. 2. The location and orientation at P may then be estimated by the navigation system.

FIG. 2 shows five lasers 210-214 provided to emit the five laser beams. However, fewer lasers may be used with beam splitters or diffractive elements to create multiple beams from one laser source. To avoid interference from room lighting the lasers may operate in the near infrared and the cameras may be equipped with near infrared bandpass optical filters. In an embodiment each laser beam is modulated or encoded so that it may be distinguished from all the others and identified by cameras equipped with appropriate demodulators or decoders. Commonly available diode lasers may be directly modulated with analog or digital signals up to tens of megahertz, suggesting, for example, sine wave modulation of each beam at a unique frequency. Alternatively, beams may be modulated with orthogonal digital codes in analogy to code-division multiple access radio systems. If one laser is split into several beams, then each beam may be provided with its own modulator.

Figure 3:
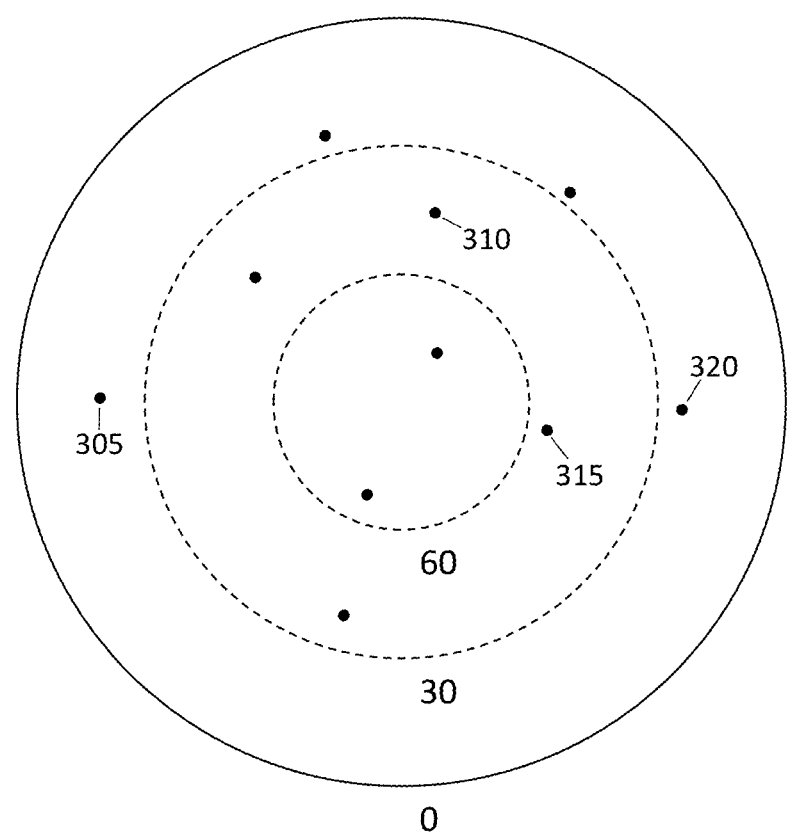
FIG. 3 is a map of projected laser beams.

FIG. 3 is a map of projected laser beams that helps visualize the situation of FIG. 2. Beams such as 305, 310, 315, 320 are represented in FIG. 3 as points where the beams would intersect a half-sphere placed over a projector such as 205. In the figure, "0", "30", and "60" represent degrees of elevation up from the horizon. Thus, for example, beams 310 and 315 are located between 30 and 60 degrees elevation. A set of laser beams spread out over the half sphere provides robustness against geometric ambiguities. Depending on the application, more beams may be placed at high elevations to avoid conflicts with potential obstructions such as object 135 in FIG. 1. A projector that emits beams below the horizon may also be used when the projector is far from the nearest room surface, for example on top of a tall robot. And, of course, the projector may be oriented sideways or even upside down for objects that move on walls or ceilings.

Figure 4:
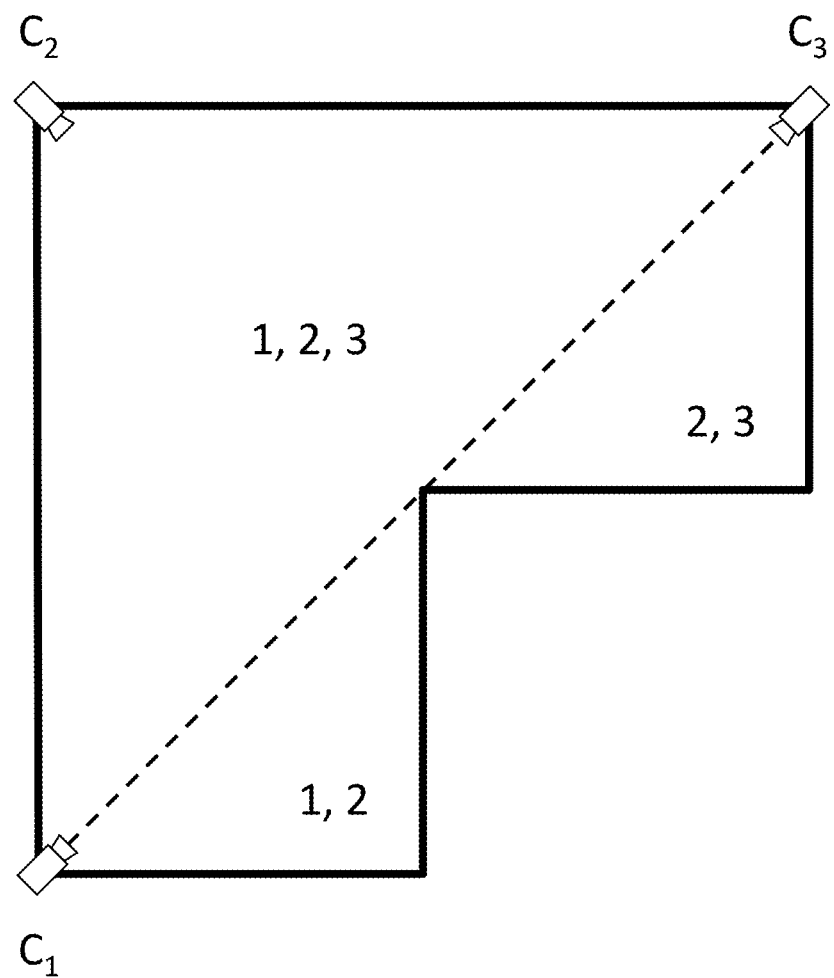
FIG. 4 illustrates a camera placement example.

Cameras, such as cameras 130 and 131 in FIG. 1 are used to estimate the position of laser spots on walls in three dimensions. This can be accomplished as long as a spot is viewable simultaneously by at least two cameras. When more cameras are available, the location of a spot may be estimated more robustly. FIG. 4 illustrates a camera placement example. In the example of FIG. 4, L-shaped room is monitored by three cameras, $C_1$, $C_2$ and $C_3$. The part of the room labeled "1, 2, 3" is viewable by all three cameras. The part labeled "1, 2" is viewable by cameras $C_1$ and $C_2$ only, while the part labeled "2, 3" is viewable by cameras $C_2$ and $C_3$ only. All parts of the room are viewable by at least two cameras.

If only one camera is available, but it is aimed at a scene with known geometry (e.g. a flat wall at a known location), then that is enough to locate laser spots. This situation may be hard to guarantee in practice, however. Using two or more cameras eliminates issues that arise when spots fall on surfaces at unknown locations. As described below, one known surface may be used during system calibration.

If the laser beams used in an indoor navigation system are near infrared, then corresponding filters may be used with the cameras to remove background room light. Similarly, if the laser beams are modulated or encoded, then the cameras may be equipped with corresponding demodulators or decoders. Finally, as used here, a "camera" includes processors or other components to demodulate or decode laser spots and report their two dimensional position in an image. Cameras may thus report a set of time-stamped two-dimensional spot coordinates to a central computer (e.g. 140 in FIG. 1) for processing. This data stream has low enough bandwidth requirements that a wireless link between cameras and the central computer may be used.

Figure 5:
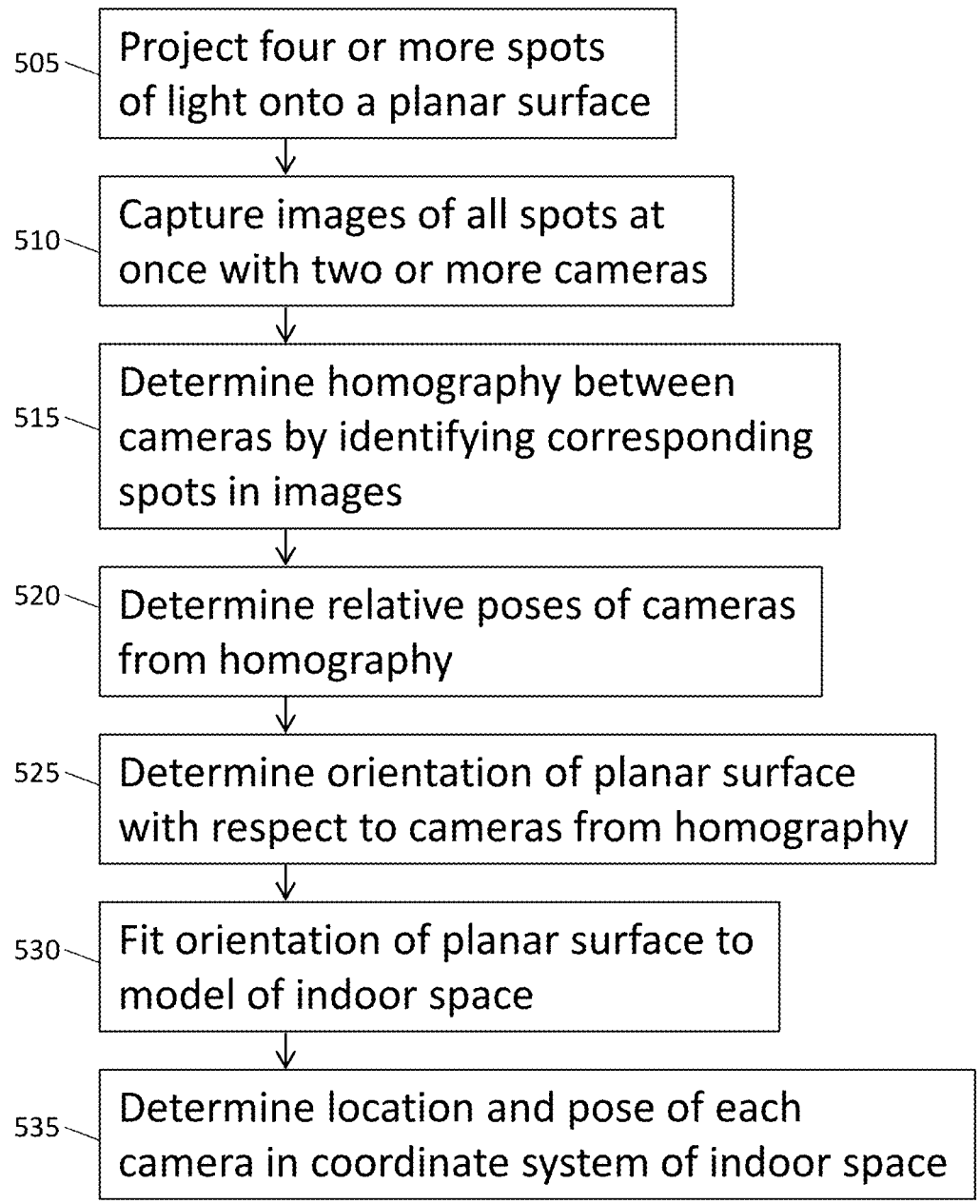
FIG. 5 is a flow chart for a calibration procedure.

Calibration is done to estimate the pose of each camera in room coordinates before navigation commences. FIG. 5 is a flow chart for one calibration procedure, others are possible. In general any method that results in the poses of each camera being determined in the coordinate system of the indoor space involved is sufficient. The procedure outlined here uses the same equipment that is later used for navigation.

The first steps 505 and 510 in the calibration procedure of FIG. 5 are to project four or more spots of light onto a planar surface such as a flat wall or ceiling and capture images of all of the spots with two or more cameras. The next step 515 is to determine or identify a homography between each pair of cameras by identifying corresponding spots in the images. The homography is then used to determine the relative poses of the cameras and the orientation of the planar surface with respect to the cameras; steps 520 and 525. Next, the planar surface is fit to a model of the indoor space of which it is a part; step 530. For example, a computer aided design model of a building may be available showing the location of a wall. Finally, the location and pose of each camera is determined in the coordinate system of the building or indoor space in step 535. Fitting a plane surface to a building design model removes an overall scale ambiguity that may not be resolvable from the homography alone. Repeating this procedure on two or more planar surfaces may also be helpful to resolve other geometric ambiguities that sometimes exist.

Figure 6A:
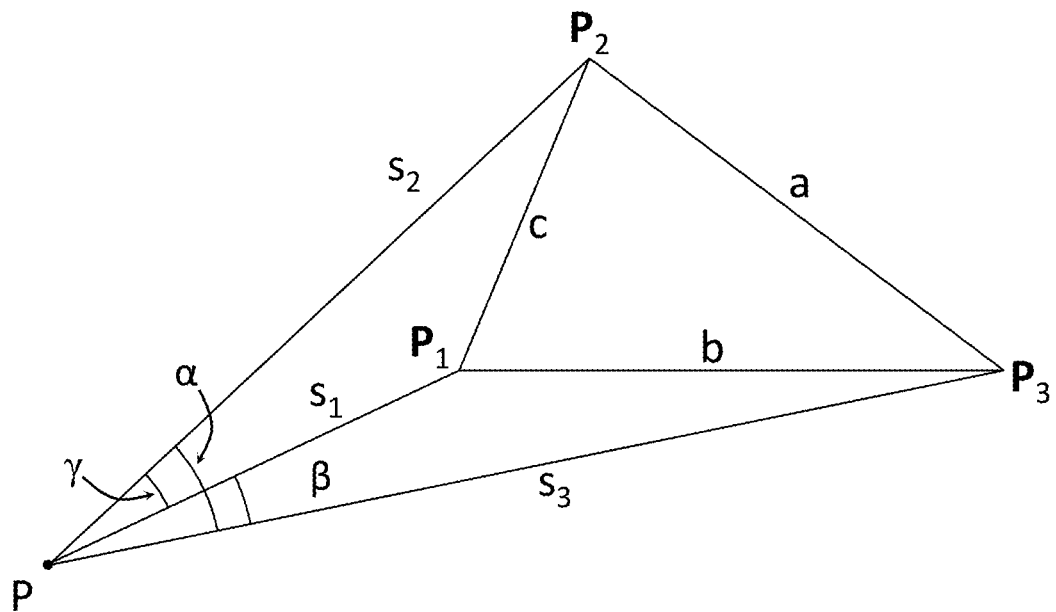
FIGS. 6A and 6B illustrate space resection geometry.
Figure 6B:
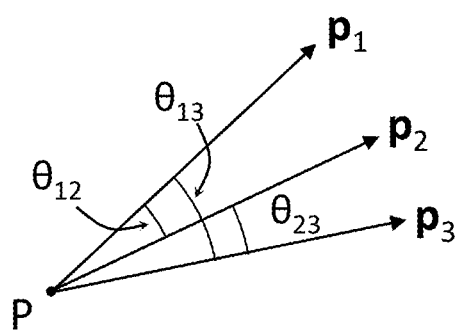

An example of indoor navigation using multi-beam laser projection is now presented using FIGS. 6A and 6B to illustrate space resection geometry. An object such as robot 105 in FIG. 1 is equipped with a laser projector as described above. The coordinate system of the object, also called the reference coordinate system, R, may be defined by two of the laser beams emitted by the projector. For example the origin of the reference coordinates may be at the intersection of the laser beams, point P in FIGS. 1, 2, 6A and 6B. The z-axis may then be defined to coincide with one of the beams and the y-axis may be the cross product of rays coincident with an ordered pair of the first beam and another beam. Coordinates used to describe a room or other indoor space are known as world coordinates, W.

After some introductory comments on notation, the example proceeds as follows. A set of reference unit vectors corresponding to the directions of laser beams projected from a laser projector are defined. Next, distances are defined from the projector to laser spots that appear on walls, ceilings or other surfaces. These distances are scalar numbers that multiply the reference unit vectors. The unit vectors and the distance scalars therefore define the position of observed laser spots in the reference (i.e. laser projector) coordinate system.

The next step in the example is to assume a transformation matrix that defines the relationship between reference and world coordinate systems. This matrix is used to find the position of observed laser spots in the world (i.e. room) coordinate system. The task of the navigation system is to find the transformation matrix given the reference unit vectors (from the design of the laser projector) and the laser spot locations in world coordinates (as observed by a set of calibrated cameras).

The mathematics of space resection has been worked out several times by various researchers independently over the last 170 years. Here we follow Haralick et al., "Review and Analysis of Solutions of the Three Point Perspective Pose Estimation Problem," International Journal of Computer Vision, 13, 3, 331-356 (1994); see, especially, p. 332-334. Other valid solutions to the space resection problem work just as well. It turns out that space resection based on three observed points often leads to more than one solution. Two solutions are common, but as many as four are possible. Thus, the next part of the example shows a way to determine which solution is correct. Finally, as an optional step, the four by four transformation matrix between reference and world coordinate systems expressed in homogenous coordinates is decomposed into Euler angles and a translation vector.

FIG. 6A is similar to Haralick FIG. 1. Point P is called the center of perspectivity by Haralick; here it is the location of the laser projector. Points $P_1$, $P_2$ and $P_3$ represent the locations of observed laser spots. Haralick uses $s_1$, $s_2$ and $s_3$ to represent the distances to these points. In the example below the distances are first defined as $m_1$, $m_2$ and $m_3$; these distances are then calculated following Haralick. a, b, c, α, β, γ in FIG. 6A correspond directly to the same symbols in Haralick. FIG. 6B illustrates unit vectors $p_1$, $p_2$ and $p_3$ that indicate the directions of laser beams emitted from a laser projector and are used to define the reference coordinate system. Angles $\theta_{ij}$ between unit vectors are discussed below.

Two functions are used to transform homogeneous coordinates to non-homogeneous coordinates and vice versa. $\mathcal{H}(\cdot)$ transforms non-homogeneous coordinates to homogenous coordinates while $\mathcal{H}^{-1}(\cdot)$ transforms homogeneous coordinates to non-homogeneous coordinates. Both functions operate on column vectors such that if $v=[v_1\ v_2\ \ldots\ v_n]^T$ then:

$$\mathcal{H}(v)=[v_1\ v_2\ \ldots\ v_n\ 1]^T$$

$$\mathcal{H}^{-1}(v)=[v_1/v_n\ v_2/v_n\ \ldots\ v_{n-1}/v_n]^T \quad (1)$$

The pose in world coordinates of the object to be tracked can be defined as the coordinate transform between reference and world coordinate systems. The transform can be carried out by left-multiplying a 4 by 1 vector, describing a homogeneous three-dimensional coordinate, by a 4 by 4 matrix $X_{R \to W}$ to give another homogeneous, three-dimensional coordinate.

Let $p_1, p_2, p_3, p_4$ denote non-homogeneous coordinates on a unit sphere for reference rays in the reference coordinate system. (See, e.g. $p_1$, $p_2$ and $p_3$ in FIG. 6B). These rays are coincident with laser beams projected by the laser projector. Let $P_1^R$, $P_2^R$, $P_3^R$, $P_4^R$ denote 3D homogeneous coordinates of detected spots (i.e. points where laser beams are incident on walls or other surfaces) along the rays in the reference coordinate system. Then:

$$P_1^R = \mathcal{H}(m_1 p_1)$$

$$P_2^R = \mathcal{H}(m_2 p_2)$$

$$P_3^R = \mathcal{H}(m_3 p_3)$$

$$P_4^R = \mathcal{H}(m_4 p_4) \quad (2)$$

where $m_1$, $m_2$, $m_3$, $m_4$ are positive scalars that describe how far along each ray light is intercepted by a surface to create a detected spot. The homogeneous coordinates of the 3D detected spots in the world coordinate system are denoted by $P_1^W, P_2^W, P_3^W, P_4^W$ where:

$$P_1^W = X_{R \to W} P_1^R$$

$$P_2^W = X_{R \to W} P_2^R$$

$$P_3^W = X_{R \to W} P_3^R$$

$$P_4^W = X_{R \to W} P_4^R \quad (3)$$

The following reference unit vectors are defined for purposes of example:

$$p_1 = [-0.71037\ -0.2867\ 0.64279]^T$$

$$p_2 = [0.71037\ 0.2867\ 0.64279]^T$$

$$p_3 = [-0.88881\ 0.45828\ 0]^T$$

$$p_4 = [0.56901\ -0.37675\ 0.73095]^T \quad (4)$$

The angle $\theta_{ij}$ between $p_i$ and $p_j$ is given by $\theta_{ij} = \cos^{-1}(p_i^T p_j)$; therefore, $$\theta_{12} = 100°,\ \theta_{13} = 60°,\ \theta_{14} = 80°$$

$$\theta_{23} = 120°,\ \theta_{24} = 40°,\ \theta_{34} = 132.7° \quad (5)$$

The set of reference vectors $p_i$ has been chosen in this example such that the angle between each pair of vectors is different. This property helps avoid ambiguities in pose estimation but is not required. For purposes of illustration, $m_i$ are chosen as follows: $m_1 = 1$, $m_2 = 4$, $m_3 = 7$ and $m_4 = 10$. Then, using equation (2), we have:

$$P_1^R = [-0.71037\ -0.2867\ 0.64279\ 1]^T$$

$$P_2^R = [2.8415\ 1.1468\ 2.5712\ 1]^T$$

$$P_3^R = [-6.2217\ 3.2079\ 0\ 1]^T$$

$$P_4^R = [5.6901\ -3.7675\ 7.3095\ 1]^T \quad (6)$$

Let us assume the following transformation matrix:

$$X_{R \to W} = \begin{bmatrix} 0.917 & -0.38924 & 0.087156 & 7 \\ 0.39439 & 0.91746 & -0.052137 & 11 \\ -0.059668 & 0.082183 & 0.99483 & 0.1 \\ 0 & 0 & 0 & 1 \end{bmatrix} \quad (7)$$

Then, using equation (3), $$P_1^W = [6.5162\ 10.423\ 0.75829\ 1]^T$$

$$P_2^W = [9.3834\ 13.039\ 2.5826\ 1]^T$$

$$P_3^W = [0.046048\ 11.489\ 0.73487\ 1]^T$$

$$P_4^W = [14.321\ 9.4065\ 6.7226\ 1]^T \quad (8)$$

We now have the required inputs, $p_1$, $p_2$, $p_3$, $P_1^W$, $P_2^W$, $P_3^W$, for a space resection algorithm such as the one described in Haralick. The algorithm determines $X_{R \to W}$ up to a possible four-fold ambiguity. To resolve the ambiguity each real solution may be checked to see whether or not it projects $P_4^W$ to $p_4$. The space resection method detailed in Haralick first determines distances from the origin to each of the reference points. These distances are called $s_1$, $s_2$, $s_3$, by Haralick and if correctly calculated should be equal to $m_1$, $m_2$, $m_3$ respectively. Given these distances we can then calculate $P_1^R$, $P_2^R$, $P_3^R$.

Given the coordinates of three 3D points expressed in both the reference coordinate system and the world coordinate system one can find the transformation matrix between the two coordinate systems. This may be done by Procrustes analysis; see, for example Peter H. Schoenemann, "A Generalized Solution of the Orthogonal Procrustes Problem", Psychometrika, 1, 31, 1-10 (1966). A simpler method is presented below, however.

If a, b, c, $\alpha$, $\beta$, $\gamma$ take the meanings described in Haralick then they can be calculated as:

$$a = \|P_2^W - P_3^W\| = 9.6436$$

$$b = \|P_1^W - P_3^W\| = 6.5574$$

$$c = \|P_1^W - P_2^W\| = 4.2882 \quad (9)$$

$$\cos \alpha = p_2^T \cdot p_3 = -0.5000$$

$$\cos \beta = p_1^T \cdot p_3 = 0.5000$$

$$\cos \gamma = p_1^T \cdot p_2 = -0.1736 \quad (10)$$

Inserting these values into Haralick's equation (9) gives:

$$A_4 = 0.1128,\ A_3 = -1.5711,\ A_2 = 6.5645,\ A_1 = -8.6784,$$
$$A_0 = 7.2201 \quad (11)$$

The quartic function in v with these coefficients has the following roots:

$$v = 7.0000 \text{ or } v = 5.4660 \text{ or } v = 0.7331 - 1.065i \text{ or}$$
$$v = 0.7331 + 1.066i \quad (12)$$

The complex roots may be ignored and the real roots substituted into Haralick's equation (8) to give corresponding values for u:

$$u = 4.0000, v = 7.0000 \text{ or } u = 2.9724, v = 5.4660 \quad (13)$$

Substituting u and v into Haralick's equations (4) and (5) leads to:

$$s_1 = 1.0000,\ s_2 = 4.0000,\ s_3 = 7.0000$$

or $$s_1 = 1.3008,\ s_2 = 3.8666,\ s_3 = 7.1104 \quad (14)$$

One can see that the first solution corresponds to the values picked for $m_1$, $m_2$, $m_3$ above. Of course, at this point we know this only because we know how the problem was constructed. We will now recover the transformation, $X_{R \to W}$, for each solution and then determine which solution is correct.

It is noted in Haralick and elsewhere that the transformation has 12 parameters but the point correspondences only give 9 equations. The conventional solution to this problem is to enforce orthogonality constraints in the rotation part of the transform to reduce the number of parameters. However there is an easier and somewhat surprising method; we can manufacture a virtual fourth point whose location is linearly independent from those of the first three points. This virtual point is consistent with a rigid transformation, so its coordinates and those of the three actual points, as expressed in the reference and world coordinate systems, give the transformation directly.

The fourth point is found by considering the vectors from one actual point to each of the other two. If we take a point that is separated from the first point by the cross product of the two vectors then we can be sure that it is not coplanar with the three actual points and is therefore linearly independent. Since in a Euclidean transform the vectors are simply rotated, so is their cross product. Hence we have a fourth point correspondence which is linearly independent but enforces the orthogonality constraint.

We call this point $P_5^R$ in the reference coordinate system and $P_5^W$ in the world coordinate system. Formally it may be defined as:

$$P_5^R = \mathcal{H}\ (\mathcal{H}^{-1}(P_1^R) + (\mathcal{H}^{-1}(P_2^R) - \mathcal{H}^{-1}(P_1^R)) \times ($$
$$\mathcal{H}^{-1}(P_3^R) - \mathcal{H}^{-1}(P_1^R)))$$

$$P_5^W = \mathcal{H}\ (\mathcal{H}^{-1}(P_1^W) + (\mathcal{H}^{-1}(P_2^W) - \mathcal{H}^{-1}(P_1^W)) \times ($$
$$\mathcal{H}^{-1}(P_3^W) - \mathcal{H}^{-1}(P_1^W))) \quad (15)$$

We first consider the solution where $s_1 = 1.0000$, $s_2 = 4.0000$, $s_3 = 7.0000$. Calculated values are indicated using a 'hat'. For example:

$$\hat{P}_1^R = \mathcal{H}\ (s_1 p_1) = [-0.7104\ -0.2867\ 0.6428\ 1]^T$$

$$\hat{P}_2^R = \mathcal{H}\ (s_2 p_2) = [2.8415\ 1.1468\ 2.5712\ 1]^T$$

$$\hat{P}_3^R = \mathcal{H}\ (s_3 p_3) = [-6.2217\ 3.2079\ 0\ 1]^T \quad (16)$$

Using equation (15) we find:

$$\hat{P}_5^R = [-8.3707\ -8.6314\ 20.9556\ 1]^T$$

$$\hat{P}_5^W = [4.5101\ -1.3129\ 20.7373\ 1]^T \quad (17)$$

Stacking 3D point correspondences gives:

$$[P_1^W \mid P_2^W \mid P_3^W \mid \hat{P}_5^W] = \hat{X}_{R \to W} [\hat{P}_1^R \mid \hat{P}_2^R \mid \hat{P}_3^R \mid \hat{P}_5^R] \quad (18)$$

$$\hat{X}_{R \to W} = [P_1^W \mid P_2^W \mid P_3^W \mid \hat{P}_5^W][\hat{P}_1^R \mid \hat{P}_2^R \mid \hat{P}_3^R \mid \hat{P}_5^R]^{-1}$$

$$\hat{X}_{R \to W} = \begin{bmatrix} 6.5162 & 9.3834 & 0.0460 & 4.5101 \\ 10.4233 & 13.0387 & 11.4894 & -1.3129 \\ 0.7583 & 2.5826 & 0.7349 & 20.7373 \\ 1 & 1 & 1 & 1 \end{bmatrix} \begin{bmatrix} -0.7104 & 2.8415 & -6.2217 & -8.3707 \\ -0.2867 & 1.1468 & 3.2079 & -8.6314 \\ 0.6428 & 2.5712 & 0.0000 & 20.9556 \\ 1 & 1 & 1 & 1 \end{bmatrix}^{-1}$$

$$\hat{X}_{R \to W} = \begin{bmatrix} 0.9170 & -0.3892 & 0.0872 & 7.0000 \\ 0.3944 & 0.9175 & -0.0521 & 11.0000 \\ -0.0597 & 0.0822 & 0.9948 & 0.1000 \\ 0 & 0 & 0 & 1 \end{bmatrix}$$

Comparison with equation (7) shows that this is the correct solution. This may be verified independently by transforming the fourth world point into reference coordinates, projecting it onto the unit sphere, and comparing to the corresponding reference unit vector:

$$\hat{P}_4^R = \hat{X}_{R \to W}^{-1} P_4^W = [5.6901 \; -3.7675 \; 7.3095 \; 1]^T$$

$$\hat{p}_4 = \mathcal{H}^{-1}(\hat{P}_4^R)/\|\mathcal{H}^{-1}(\hat{P}_4^R)\| = [0.5690 \; -0.3767 \; 0.7310]^T \quad (19)$$

Comparing this to equation (4) shows that the fourth world point does indeed agree with the fourth reference coordinate and we can therefore conclude that the calculated transform is correct.

Now consider the second solution where $s_1 = 1.3008$, $s_2 = 3.8666$, $s_3 = 7.1104$. Plugging these values into equation (2) gives:

$$\hat{P}_1^R = [-0.9241 \; -0.3729 \; 0.8362 \; 1]^T$$

$$\hat{P}_2^R = [2.7467 \; 1.1085 \; 2.4854 \; 1]^T$$

$$\hat{P}_3^R = [-6.3198 \; 3.2585 \; 0.0000 \; 1]^T$$

$$\hat{P}_5^R = [-8.1519 \; -6.2022 \; 22.1599 \; 1]^T \quad (20)$$

Stacking these points as we did in equation (18) leads to the transform matrix:

$$\hat{X}_{R \to W} = \begin{bmatrix} 6.5162 & 9.3834 & 0.0460 & 4.5101 \\ 10.4233 & 13.0387 & 11.4894 & -1.3129 \\ 0.7583 & 2.5826 & 0.7349 & 20.7373 \\ 1 & 1 & 1 & 1 \end{bmatrix} \begin{bmatrix} -0.9241 & 2.7467 & -6.3198 & -8.1519 \\ -0.3729 & 1.1085 & 3.2585 & -6.2022 \\ 0.8362 & 2.4854 & 0.0000 & 22.1599 \\ 1 & 1 & 1 & 1 \end{bmatrix}^{-1} \quad (21)$$

$$\hat{X}_{R \to W} = \begin{bmatrix} 0.9043 & -0.4153 & 0.0989 & 7.1142 \\ 0.4265 & 0.8898 & -0.1626 & 11.2852 \\ -0.0205 & 0.1892 & 0.9817 & -0.0109 \\ 0 & 0 & 0 & 1 \end{bmatrix}$$

Testing this with the fourth world point leads to:

$$\hat{P}_4^R = \hat{X}_{R \to W}^{-1} P_4^W = [5.5783 \; -3.3910 \; 7.6286 \; 1]^T$$

$$\hat{p}_4 = \mathcal{H}^{-1}(\hat{P}_4^R)/\|\mathcal{H}^{-1}(\hat{P}_4^R)\| = [0.5556 \; -0.3377 \; 0.7598]^T \quad (22)$$

Here the elements of $\hat{p}_4$ differ from those of $p_4$ (see equation (4)) indicating that this is not a correct solution.

For many purposes it is unnecessary to decompose the transformation matrix, $\hat{X}_{R \to W}$; however we present the decomposition here for completeness. The transform describes directly how the basis vectors of one coordinate system relate to the basis vectors of another. The coordinate system is defined by the point at infinity on the x-axis, the point at infinity on the y-axis, the point at infinity on the z-axis, and the origin. We denote the basis vectors of the reference coordinate system in world coordinates as $B_R^W$, and the basis vectors of the reference coordinate system in reference coordinates as $B_R^R$. If we stack the basis vectors we get the four by four identity matrix:

$$B_R^R = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (23)$$

Since, $$B_R^W = \hat{X}_{R \to W} B_R^R = \hat{X}_{R \to W} \quad (24)$$

the transformation can be read as the basis vectors of the reference coordinate system in the world coordinate system. Thus the question "What is the position of the reference system (i.e. the laser projector)?" is equivalent to asking "Where is the origin of the reference coordinate frame in the world coordinate system?" This is given by the fourth column of $\hat{X}_{R \to W}$; the column that corresponds to $[0 \; 0 \; 0 \; 1]^T$ in $B_R^R$. Likewise the other columns tell us how the reference frame has rotated (i.e. the orientation of the laser projector). However, those unfamiliar with projective geometry often prefer to consider the rotation in terms of Euler angles. For a z-y-x Euler sequence we can consider the transformation to be composed as:

$$\hat{X}_{R \to W} = T(\hat{x}, \hat{y}, \hat{z}) R_x(\hat{\theta}_x) R_y(\hat{\theta}_y) R_z(\hat{\theta}_z) \ldots \text{where} \ldots \quad (25)$$

$$R_z(\hat{\theta}_z) = \begin{bmatrix} \cos(\hat{\theta}_z) & -\sin(\hat{\theta}_z) & 0 & 0 \\ \sin(\hat{\theta}_z) & \cos(\hat{\theta}_z) & 0 & 0 \\ 0 & 0 & 1 & 0 \\ 0 & 0 & 0 & 1 \end{bmatrix}$$

$$R_y(\hat{\theta}_y) = \begin{bmatrix} \cos(\hat{\theta}_y) & 0 & \sin(\hat{\theta}_y) & 0 \\ 0 & 1 & 0 & 0 \\ -\sin(\hat{\theta}_y) & 0 & \cos(\hat{\theta}_y) & 0 \\ 0 & 0 & 0 & 1 \end{bmatrix}$$

-continued $$R_x(\hat{\theta}_x) = \begin{bmatrix} 1 & 0 & 0 & 0 \\ 0 & \cos(\hat{\theta}_x) & -\sin(\hat{\theta}_x) & 0 \\ 0 & \sin(\hat{\theta}_x) & \cos(\hat{\theta}_x) & 0 \\ 0 & 0 & 0 & 1 \end{bmatrix}$$

$$T(\hat{x}, \hat{y}, \hat{z}) = \begin{bmatrix} 1 & 0 & 0 & \hat{x} \\ 0 & 1 & 0 & \hat{y} \\ 0 & 0 & 1 & \hat{z} \\ 0 & 0 & 0 & 1 \end{bmatrix}$$

In this convention $\theta_z$ (yaw) is a counter-clockwise rotation about the z-axis, $\theta_y$ (pitch) is a counter-clockwise rotation about the new y-axis, $\theta_x$ (roll) is a counter-clockwise rotation about the new x-axis. To avoid singularities in the inversion of the transform $\theta_y$ is restricted to the open interval $-90° < \theta_y < 90°$. When $\theta_y = \pm 90°$ gimbal lock occurs and Euler angles are inadequate for describing the rotation. With this caveat the transform can be decomposed as:

$$\hat{\theta}_x = \text{atan2}(-\hat{r}_{23}, \hat{r}_{33}) \quad (26)$$

$$\hat{\theta}_y = \sin^{-1}(\hat{r}_{13})$$

$$\hat{\theta}_z = \text{atan2}(-\hat{r}_{12}, \hat{r}_{11}) \ldots \text{where} \ldots$$

$$\hat{X}_{R \to W} = \begin{bmatrix} \hat{r}_{11} & \hat{r}_{12} & \hat{r}_{13} & \hat{x} \\ \hat{r}_{21} & \hat{r}_{22} & \hat{r}_{23} & \hat{y} \\ \hat{r}_{31} & \hat{r}_{32} & \hat{r}_{33} & \hat{z} \\ 0 & 0 & 0 & 1 \end{bmatrix}$$

Applying this to the transformation of equation (18) we get:

$$\hat{X}_{R \to W} = \begin{bmatrix} 0.9170 & -0.3892 & 0.0872 & 7.0000 \\ 0.3944 & 0.9175 & -0.0521 & 11.0000 \\ -0.0597 & 0.0822 & 0.9948 & 0.1000 \\ 0 & 0 & 0 & 1 \end{bmatrix} \quad (27)$$

$$\hat{\theta}_x = \text{atan2}(-0.0521, 0.9948) = 3°$$

$$\hat{\theta}_y = \sin^{-1}(0.0872) = 5°$$

$$\hat{\theta}_z = \text{atan2}(-0.3892, 0.9170) = 23°$$

$$\hat{x} = 7$$

$$\hat{y} = 11$$

$$\hat{z} = 0.1$$

Thus the position of the origin of the reference coordinate system (i.e. the position of the laser projector) expressed in the world coordinate system is (7, 11, 0.1) and the orientation of the laser projector in the world coordinate system is described by Euler angles 3°, 5° and 23°.

To recap: Knowledge of the location of laser spots on the walls of a room, combined with knowledge of the relative directions of laser beams emitted by a laser projector, leads to the location and orientation of the laser projector expressed in room coordinates. The location of the spots is determined with a calibrated set of cameras and the relative directions of the projected laser beams are set during manufacture and/or set-up of the laser projector.

A few subtleties of the system and methods described above are worth mentioning or revisiting at this point. For example, in an embodiment the directions of each laser beam coincide at a point, P. If this is not the case the mathematics of the space resection problem becomes more complicated.

Correspondences between laser beams and their spots may be accomplished by trial and error until a solution to the space resection problem is found. This process is made more robust when the angles between pairs of laser beams are different.

Alternatively, each laser beam may be modulated or encoded to facilitate identification. Each beam may be modulated with its own frequency sine wave or its own pseudo random code, as examples. Demodulating cameras may be used to identify beams or demodulation may be done later using a separate microprocessor. Unique beam identification becomes even more helpful when multiple laser projectors (e.g. on multiple robots or other objects) are tracked at once.

The use of four, five or even more beams per laser projector helps make the system more robust in the face of potential geometric ambiguities. Furthermore, once an ambiguity has been resolved, such as finding that the first rather than the second solution is correct in the example above, it will tend to stay resolved in the same way as a tracked object makes incremental movements from one location and pose to the next.

Figure 7:
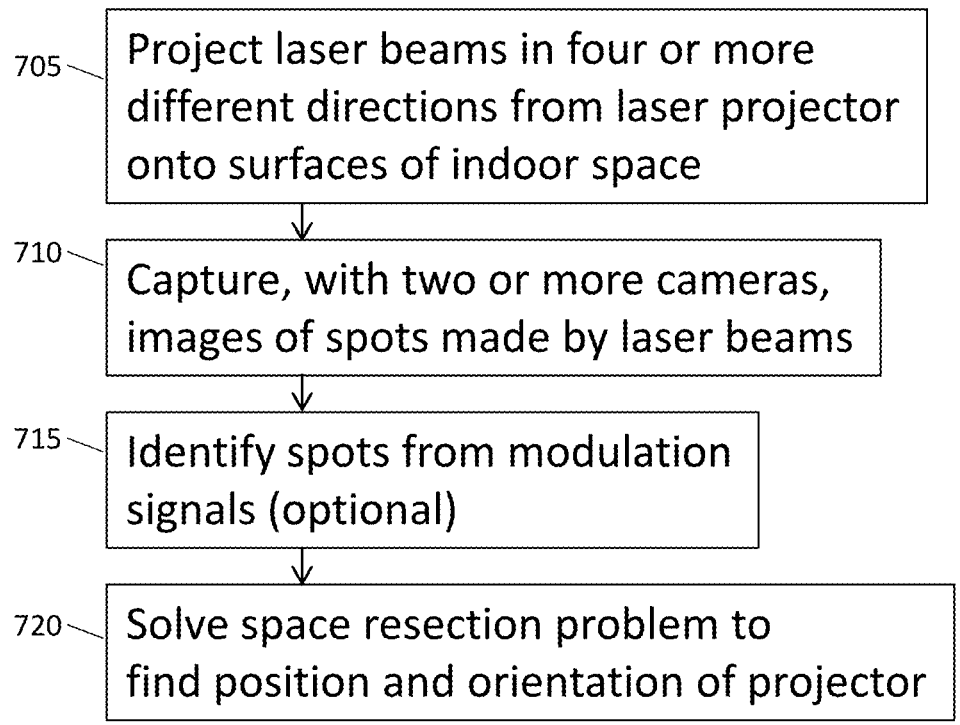
FIG. 7 is a flow chart for an indoor navigation method.

In light of the detailed example given above and the subtleties just mentioned, FIG. 7 is a flow chart for an indoor navigation method. According to FIG. 7, the first step 705 in the method is to project laser beams in four or more different directions from a laser projector onto surfaces of an indoor space. Next, in step 710, images of the spots made by the beams are captured with two or more cameras. At least two cameras are necessary to determine the three dimensional position of the laser spots in the coordinate system of the indoor space. Ideally images are captured by each camera at the same time. Delay between images may reduce the accuracy of the system depending on the speed of a tracked object. Cameras may provide a time-stamp along with the two dimensional coordinates of observed laser spots so that a processor can use sets of spots observed as close to simultaneously as possible.

The next step 715 is to identify the observed points based on unique modulation signals applied to each laser beam. This step is not required if no laser modulation is used. Given the observed location of laser spots as determined from data supplied by two or more cameras and knowledge of the geometry of the laser projector, the space resection problem is now solved in step 720. The solution may proceed in analogy to the example provided above or it may use another method. The solution may include resolving geometric ambiguities which may arise.

The solution includes comparing the coordinates of known points (e.g. laser spots) as expressed in reference and world coordinates to find a matrix describing a coordinate transform between the two coordinate systems. This may be done though Procrustes analysis or using the method of manufacturing a virtual, linearly independent point as described above.

A system including a multi-beam laser projector attached to an object to be tracked, a set of calibrated cameras that observe laser spots on the walls of a room, and a processor that solves the space resection problem is thus able to provide an indoor navigation solution. The system avoids many difficulties associated with traditional camera-based navigation including issues such as occlusion and geometric insensitivity while requiring neither extraordinary processing power nor high-bandwidth data transfer.

The above description of the disclosed embodiments is provided to enable any person skilled in the art to make or use the invention. Various modifications to these embodiments will be readily apparent to those skilled in the art, and the principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. An indoor navigation system comprising:
   a laser projector configured to emit four or more laser beams in four or more different predetermined directions, no more than two laser beams of the four or more laser beams extending along a same plane, and an angle between each pair of the four or more laser beams being different from an angle between any other pair of the four or more laser beams, wherein the four or more different predetermined directions and the angle between each pair of the four or more laser beams corresponds to a reference coordinate system associated with the laser projector;
   two or more cameras configured to capture images of at least four spots formed by the four or more laser beams on surfaces of an indoor space, the two or more cameras each disposed in a fixed position and having a known location and pose in a world coordinate system; and
   one or more processors in communication with the two or more cameras, the one or more processors configured to:
      estimate three-dimensional locations of the at least four spots using the images captured by at least two of the two or more cameras, wherein each of the three-dimensional locations of the at least four spots corresponds to the world coordinate system, and wherein the world coordinate system is associated with the indoor space; and
      estimate a position and an orientation of the laser projector in the world coordinate system in the indoor space by space resection using the four or more different directions corresponding to the reference coordinate system and the three-dimensional locations corresponding to the world coordinate system of the at least four spots.

2. The system of claim 1, wherein the four or more different directions coincide at a point.

3. The system of claim 1, wherein the four or more laser beams have an infrared wavelength and the two or more cameras are equipped with infrared filters to select the infrared wavelength in preference to background light.

4. The system of claim 1, wherein each of the four or more laser beams is modulated with a modulation signal that distinguishes the laser beam from all others of the four or more laser beams, and each of the two or more cameras demodulate the modulation signal to identify a correspondence between the at least four spots and the four or more different directions.

5. The system of claim 4, wherein the modulation signal is sinusoidal.

6. The system of claim 4, wherein the modulation signal is a pseudorandom code.

7. A method for indoor navigation comprising:
   emitting, using a laser projector, four or more laser beams in four or more different predetermined directions, the four or more laser beams being non-coplanar, and an angle between each pair of the four or more laser beams being different from an angle between any other pair of the four or more laser beams, wherein the four or more different predetermined directions and the angle between each pair of the four or more laser beams corresponds to a reference coordinate system associated with the laser projector;
   capturing, with two or more cameras each disposed in a fixed position and at a known location and pose in a world coordinate system associated with an indoor space, images of at least four spots formed by the four or more laser beams on surfaces of the indoor space; thereafter
   estimating three-dimensional locations of the at least four spots in the world coordinate system using the images and the known location and pose of each of the two or more cameras; and
   estimating a position and an orientation of the laser projector in the world coordinate system by space resection using the four or more different directions corresponding to the reference coordinate system and the three-dimensional locations of the at least four spots corresponding to the world coordinate system.

8. The method of claim 7, wherein the space resection includes:
   creating a virtual point not coplanar with three actual spot locations used in the resection;
   using correspondences between locations of the three actual spots and the virtual point expressed with respect to the indoor space and the laser projector to establish a transformation matrix; and
   using the transformation matrix to test a fourth actual spot to resolve geometric ambiguities in resection.

9. The method of claim 7, wherein each of the four or more laser beams is modulated with a modulation signal that distinguishes the laser beam from all others of the four or more laser beams, and each of the two or more cameras demodulate the modulation signal to identify a correspondence between the at least four spots and the four or more different directions.

10. The method of claim 9, wherein the modulation signal is sinusoidal.

11. The method of claim 9, wherein the modulation signal is a pseudorandom code.

12. The method of claim 7, wherein the four or more different directions coincide at a point.

13. The method of claim 7, wherein the four or more laser beams have an infrared wavelength and the two or more cameras are equipped with infrared filters to select the infrared wavelength in preference to background light.

14. The method of claim 7, wherein the one or more surfaces of the indoor space comprise at least two surfaces, and at least two of the at least four spots are formed on two different surfaces of the at least two surfaces.

* * * * *